(12) United States Patent
Song et al.

(10) Patent No.: US 9,390,794 B2
(45) Date of Patent: Jul. 12, 2016

(54) SEMICONDUCTOR DEVICE AND OPERATING METHOD THEREOF

(71) Applicant: SK hynix Inc., Icheon-si Gyeonggi-do (KR)

(72) Inventors: Young-Ook Song, Seoul (KR); Jin Cheng, Seoul (KR); Hong-Sik Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/567,092

(22) Filed: Dec. 11, 2014

(65) Prior Publication Data

US 2015/0340088 A1    Nov. 26, 2015

(30) Foreign Application Priority Data

May 21, 2014    (KR) .................. 10-2014-0060917

(51) Int. Cl.

| | |
|---|---|
| *G11C 16/04* | (2006.01) |
| *G11C 16/26* | (2006.01) |
| *G11C 27/00* | (2006.01) |
| *G11C 13/00* | (2006.01) |
| *G11C 11/56* | (2006.01) |
| *G11C 7/08* | (2006.01) |
| *G11C 7/14* | (2006.01) |
| *G11C 16/34* | (2006.01) |

(52) U.S. Cl.
CPC ............... *G11C 13/004* (2013.01); *G11C 7/08* (2013.01); *G11C 7/14* (2013.01); *G11C 11/5678* (2013.01); *G11C 13/0035* (2013.01); *G11C 16/0483* (2013.01); *G11C 16/26* (2013.01); *G11C 16/3404* (2013.01); *G11C 27/00* (2013.01); *G11C 2211/5641* (2013.01)

(58) Field of Classification Search
CPC ............... G11C 16/0483; G11C 16/26; G11C 16/3404; G11C 2211/5641; G11C 16/5642
USPC ................. 365/185.03, 185.24, 185.21
See application file for complete search history.

(56) References Cited

U.S. PATENT DOCUMENTS

| | | | | |
|---|---|---|---|---|
| 5,805,478 A | * | 9/1998 | Kim ................ | H03M 5/145 708/323 |
| 6,094,368 A | * | 7/2000 | Ching ............... | G06F 12/1408 365/185.03 |
| 6,259,627 B1 | * | 7/2001 | Wong ............... | G11C 11/5621 365/185.03 |
| 7,511,646 B2 | | 3/2009 | Cornwell et al. | |
| 8,369,141 B2 | | 2/2013 | Sommer et al. | |
| 2009/0129153 A1 | * | 5/2009 | Sarin ............... | G11C 11/5628 365/185.03 |
| 2009/0310406 A1 | * | 12/2009 | Sarin ............... | G11C 11/5628 365/185.03 |

OTHER PUBLICATIONS

Papandreou, N., et al. "Drift-Tolerant Multilevel Phase-Change Memory." Memory Workshop (IMW), 3rd IEEE International. IEEE, 2011, Zurich, Switzerland.

* cited by examiner

*Primary Examiner* — Ly D Pham
(74) *Attorney, Agent, or Firm* — William Park & Associates Ltd.

(57) ABSTRACT

A semiconductor device may include a candidate selector configured for generating a plurality of candidate threshold value sets from a plurality of digital values corresponding to a plurality of analog signals output from a memory cell array. The semiconductor device may include a threshold value selector configured for selecting one candidate threshold value set of the plurality of candidate threshold value sets as a threshold value set. The semiconductor device may include a comparator configured for deciding logic levels of the plurality of digital values according to the selected threshold value set.

17 Claims, 12 Drawing Sheets

SEMICONDUCTOR DEVICE AND OPERATING METHOD THEREOF

The present application claims priority under 35 U.S.C. §119(a) to Korean application number 10-2014-0060917, filed on May 21, 2014, in the Korean Intellectual Property Office, which is incorporated herein by reference in its entirety as set forth in full.

BACKGROUND

1. Technical Field

Various embodiments generally relate to a semiconductor device and an operating method thereof. Particularly, the various to embodiments relate to a semiconductor device capable of reading correct data even though a drift phenomenon occurs in a memory cell and an operating method thereof.

2. Related Art

In a memory device, there may occur a drift phenomenon. A drift phenomenon is where information (for example, a resistance value) of a memory cell is changed according to the passage of time. Such a drift phenomenon is particularly problematic in a phase change memory device (PCRAM).

FIG. 1 is a graph illustrating a change in the resistance of a PCRAM cell due to a drift phenomenon.

In the illustrated graph, the PCRAM cell is a multilevel cell capable of writing 2 bits and stores information of four states level 0 (00), level 1 (01), level 2 (10), and level 3 (11). A resistance value corresponding to each state is the largest in the case of level 0 and is the smallest in the case of level 3.

When the drift phenomenon occurs, the resistance value of the cell is changed according to the passage of time. Therefore, when a threshold value used at the time point, at which data is written, is applied to the time point at which the data is read, an error may occur. However, since it is not possible to know the degree in which the drift phenomenon progresses at the time point at which the data is read, it is difficult to find an exact threshold value.

SUMMARY

In an embodiment, a semiconductor device may include a candidate selector configured for generating a plurality of candidate threshold value sets from a plurality of digital values corresponding to a plurality of analog signals output from a memory cell array. The semiconductor device may include a threshold value selector configured for selecting one candidate threshold value set of the plurality of candidate threshold value sets as a threshold value set. The semiconductor device may include a comparator configured for deciding logic levels of the plurality of digital values according to the selected threshold value set.

In an embodiment, a semiconductor memory device may include a memory cell array, and an analog-to-digital conversion unit configured for outputting a plurality of digital values corresponding to a plurality of analog signals output from the memory cell array. The semiconductor device may include a decision block that selects a threshold value set from the plurality of digital values and decides logic levels of the plurality of digital values according to the selected threshold value set.

In an embodiment, a memory system may include a semiconductor memory device configured for outputting a plurality of analog signals output from a memory cell array. The semiconductor memory device may include an analog-to-digital conversion unit configured for outputting a plurality of digital values corresponding to to the plurality of analog signals output from the memory cell array. The semiconductor memory device may include a decision block configured for selecting a threshold value set from the plurality of output digital values and for deciding logic levels of the plurality of digital values according to the selected threshold value set.

In an embodiment, a memory system may include a semiconductor memory device including a memory cell array and an analog-to-digital conversion unit configured for outputting a plurality of digital values corresponding to a plurality of analog signals output from the memory cell array. The semiconductor memory device may include a decision block configured for selecting a threshold value set from the plurality of digital values and for deciding logic levels of the plurality of digital values according to the selected threshold value set.

In an embodiment, a method for operating a semiconductor device may include a first step of sorting a plurality of digital values and generating a first array, and a second step of selecting L first candidate threshold values from the first array (L is a natural number). The method for operating a semiconductor device may include a third step of dividing the first array into a $1\text{-}1^{th}$ array and a $1\text{-}2^{th}$ array with respect to each of the L first candidate threshold values, selecting a second candidate threshold value from the $1\text{-}1^{th}$ array, and selecting a third candidate threshold value from the $1\text{-}2^{th}$ array. The method for operating a semiconductor device may include a fourth step of applying each of the L first candidate threshold values to the first to array to calculate a metric value, and deciding a threshold value set according to the calculated metric value. The method for operating a semiconductor device may include a fifth step of deciding logic levels of the plurality of digital values according to the selected threshold value set.

DETAILED DESCRIPTION

Hereinafter, a semiconductor device and an operating method thereof according to various embodiments will be described in detail with reference to the accompanying drawings through the various examples of embodiments.

The various embodiments may be applied to all semiconductor memory devices in which a drift phenomenon occurs, and the embodiments will be described on the assumption that a semiconductor memory device is, for example but not limited to, a phase change memory device (PCRAM). However, the scope of the application is not limited in this manner and may be applied to other memory devices.

A semiconductor device capable of reading correct data in a memory cell even though a drift phenomenon occurs and an operating method thereof are described herein.

Through a semiconductor device and an operating method thereof according to the present technology, it may be possible to easily find an exact threshold value regardless of the degree in which a drift phenomenon progresses. Consequently, regardless of the degree in which the drift phenomenon occurs, it may be possible to read correct data from a memory cell.

Figure 1:
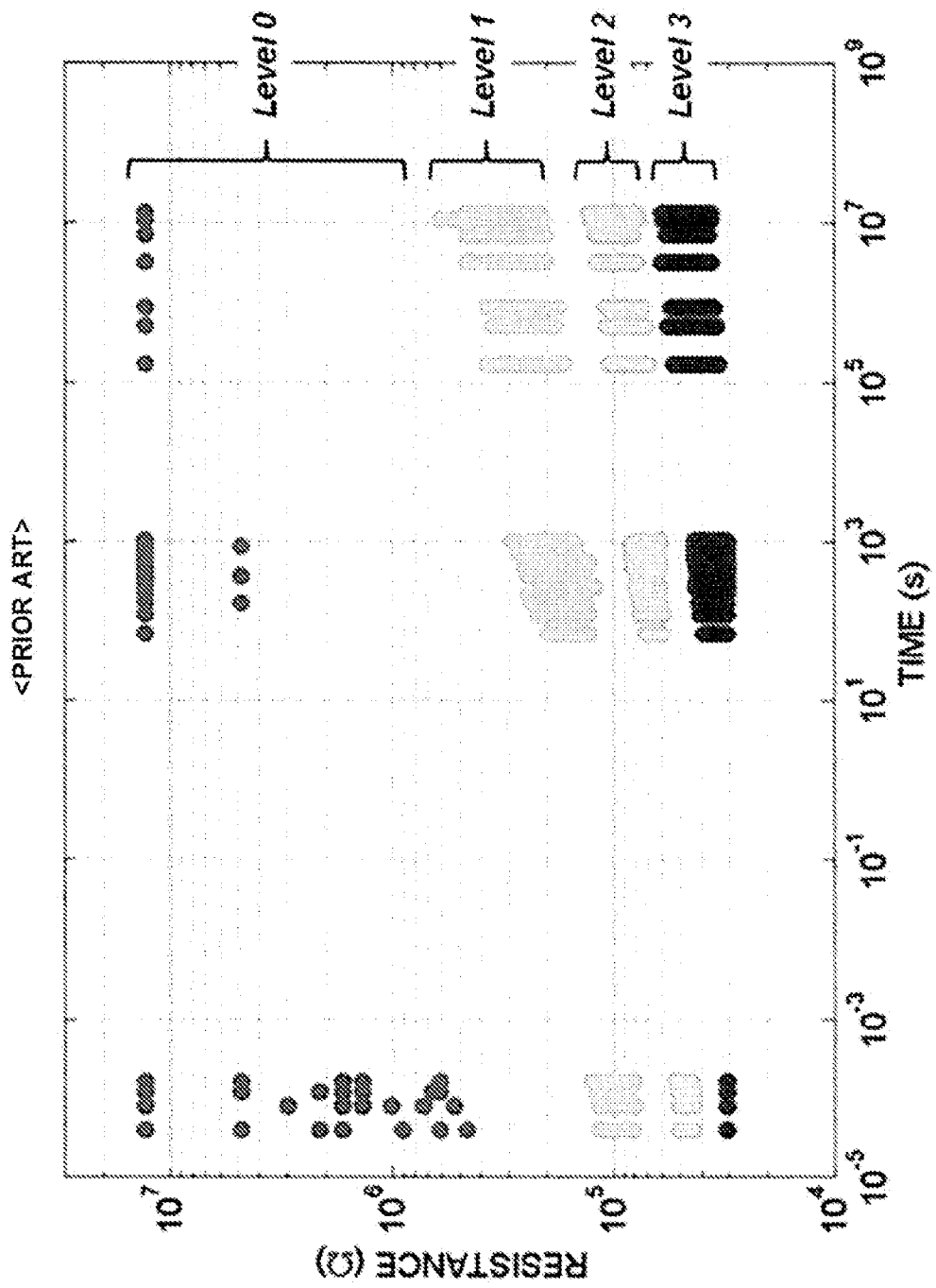
FIG. 1 is a graph illustrating a drift phenomenon in a PCRAM cell.
Figure 2:
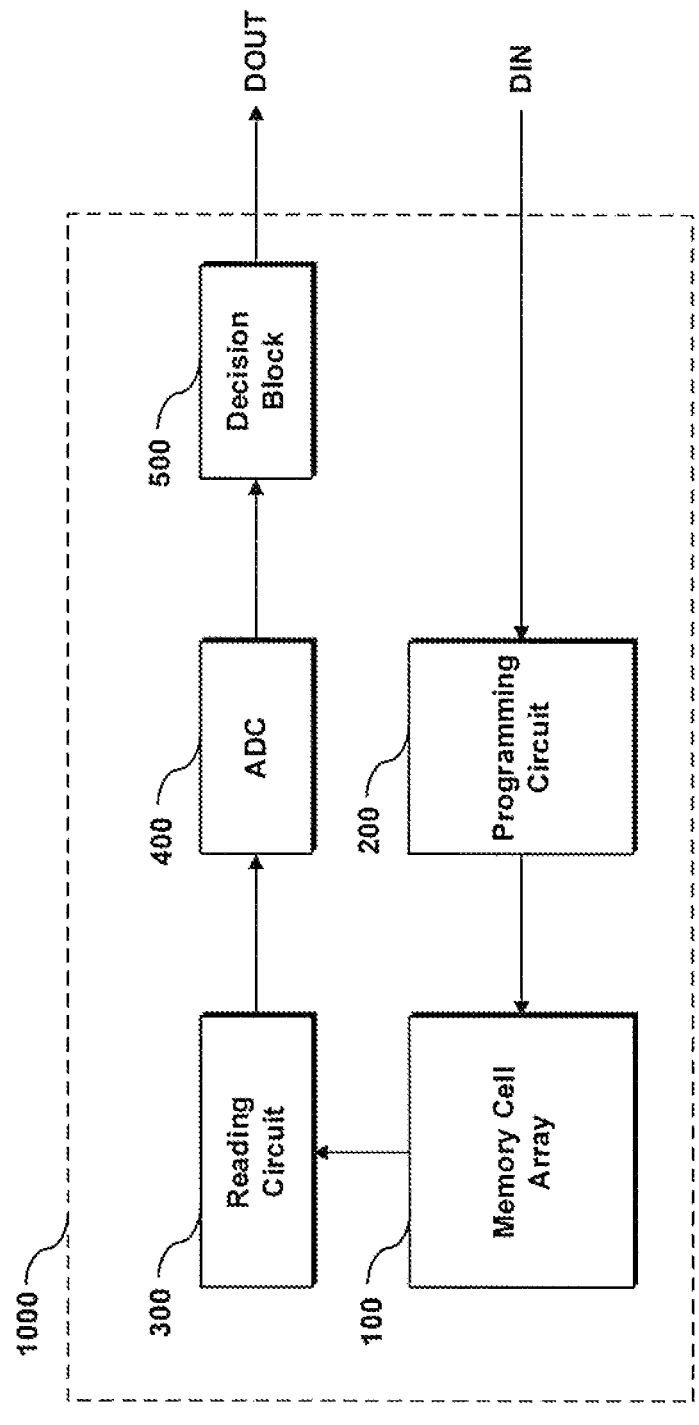
FIG. 2 is a block diagram of a representation of a semiconductor memory device according to an embodiment.

FIG. 2 is a block diagram of a representation of a semiconductor memory device 1000 according to an embodiment.

The semiconductor memory device 1000 according to an embodiment may include a memory cell array 100 and a programming circuit 200. The programming circuit 200 may write input data into the memory cell array 100. The semiconductor memory device may include a reading circuit 300. The reading circuit may read data from the memory cell array 100.

The operations and configurations of the memory cell array 100, the programming circuit 200, and the reading circuit 300 are substantially the same as those of a memory cell array, a programming circuit, and a reading circuit included in a phase change memory device.

The programming circuit 200 programs the memory cell array 100 of an address requested to be written so as to have a resistance value corresponding to digital data input DIN to the semiconductor memory device 1000. The programming circuit 200 receives data input DIN.

The reading circuit 300 outputs an analog data value from the memory cell array 100 of an address requested to be read of the semiconductor memory device 1000. The output analog data value may have a value different from an originally written analog data value due to a drift phenomenon.

In an embodiment, it is assumed that the reading circuit 300 reads the whole or a part of simultaneously written data at a time. That is, in an embodiment, cells, which are affected by the drift phenomenon at similar time, are read simultaneously and original data are decided from what are read from these cells.

For example, in the example of the semiconductor memory device 1000 that writes data in units of pages, the reading circuit 300 may read one simultaneously written page at a time.

Furthermore, in an embodiment, it is assumed that simultaneously read data includes all possible logic levels.

The semiconductor memory device 1000 according to an embodiment may include an analog-to-digital conversion (ADC) unit 400 and a decision block 500 that interprets the output of the analog-to-digital conversion unit 400 and decides a digital value of data requested to be read.

The analog-to-digital conversion unit 400 converts respective analog values output from the reading circuit 300 into digital values.

The resolution of the digital values output from the analog-to-digital conversion unit 400 may be changed according to the various embodiments. However, it may be preferable that the resolution is higher than a bit number of data stored in each memory cell of the memory cell array 100. For example, when the memory cell array 100 includes a multilevel cell that stores 2 bits, it may be preferable that the resolution of the analog-to-digital conversion unit 400 is greater than 2 bits.

The decision block 500 decides and outputs the logic levels of the digital values output from the analog-to-digital conversion unit 400 (i.e., DOUT or data out). The decision block 500 performs a function of restoring original data from data having suffered from the drift phenomenon.

The decision block 500 may decide threshold values among respective logic levels from the digital values output from the analog-to-digital conversion unit 400, and decides the logic levels of data from the threshold values for output. For example, in the examples in which a cell of the memory cell array 100 stores n bits (n is a natural number), the decision block 500 may decide $2^n-1$ threshold values.

The configuration and operation of the decision block 500 s will be further described below.

Figure 3:
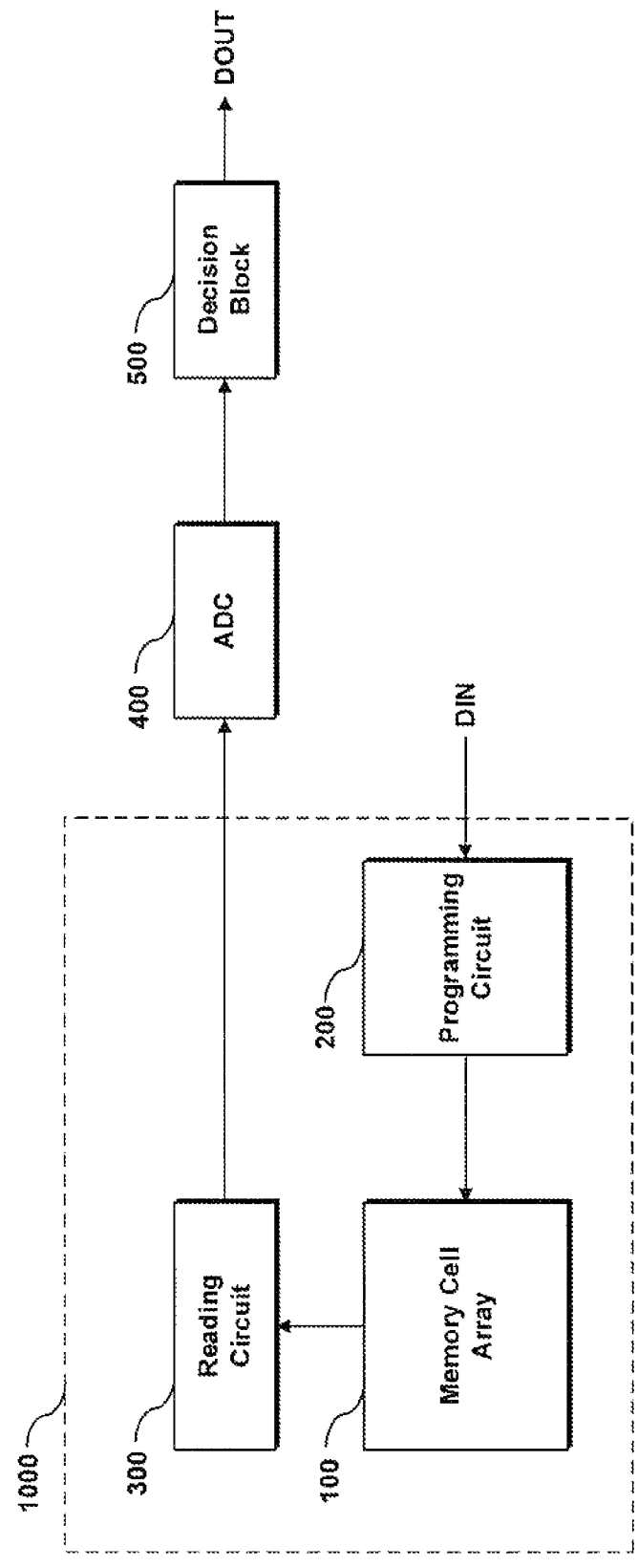
FIG. 3 is a block diagram of a representation of a system according to an embodiment.

FIG. 3 is a block diagram of a representation of a system according to an embodiment.

Referring to FIG. 3, the analog-to-digital conversion unit 400 and the decision block 500 exist outside the semiconductor memory device 1000, as opposed to what is illustrated in FIG. 2.

The analog-to-digital conversion unit 400 and the decision block 500 may be included as a part of a CPU and a memory controller that control the semiconductor memory device 1000. The analog-to-digital conversion unit 400 and the decision block 500 may also be implemented as a semiconductor device independent of them. See FIG. 2 for the associated descriptions of the memory cell array 100, reading circuit 300, and programming circuit 200 of FIG. 3.

Figure 4:
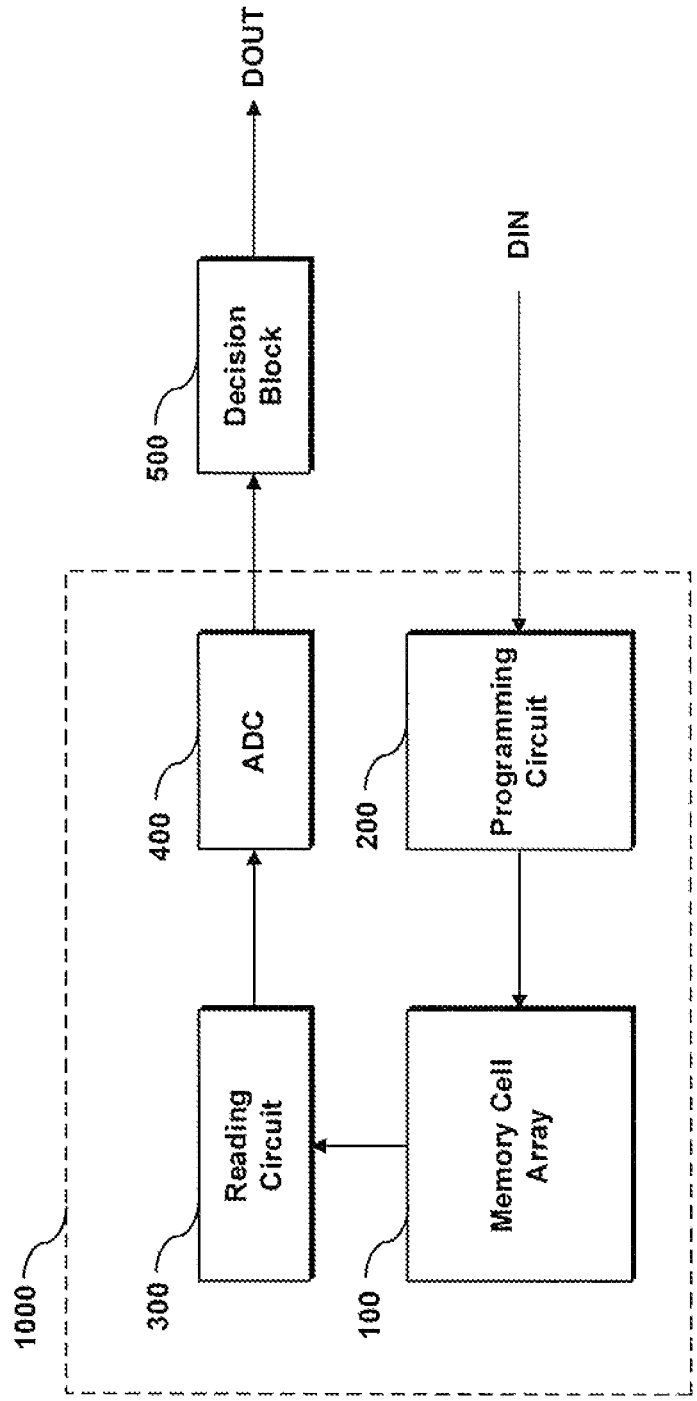
FIG. 4 is a block diagram of a representation of a system according to an embodiment.

FIG. 4 is a block diagram of a representation of a system according to an embodiment.

In an embodiment of FIG. 4, only the decision block 500 exists outside the semiconductor memory device 1000, differently from the embodiment of FIG. 2.

The decision block 500 may be included in a CPU and a memory controller that control the semiconductor memory device 1000. The decision block 500 may also be implemented as a semiconductor device independent of them.

Figure 5:
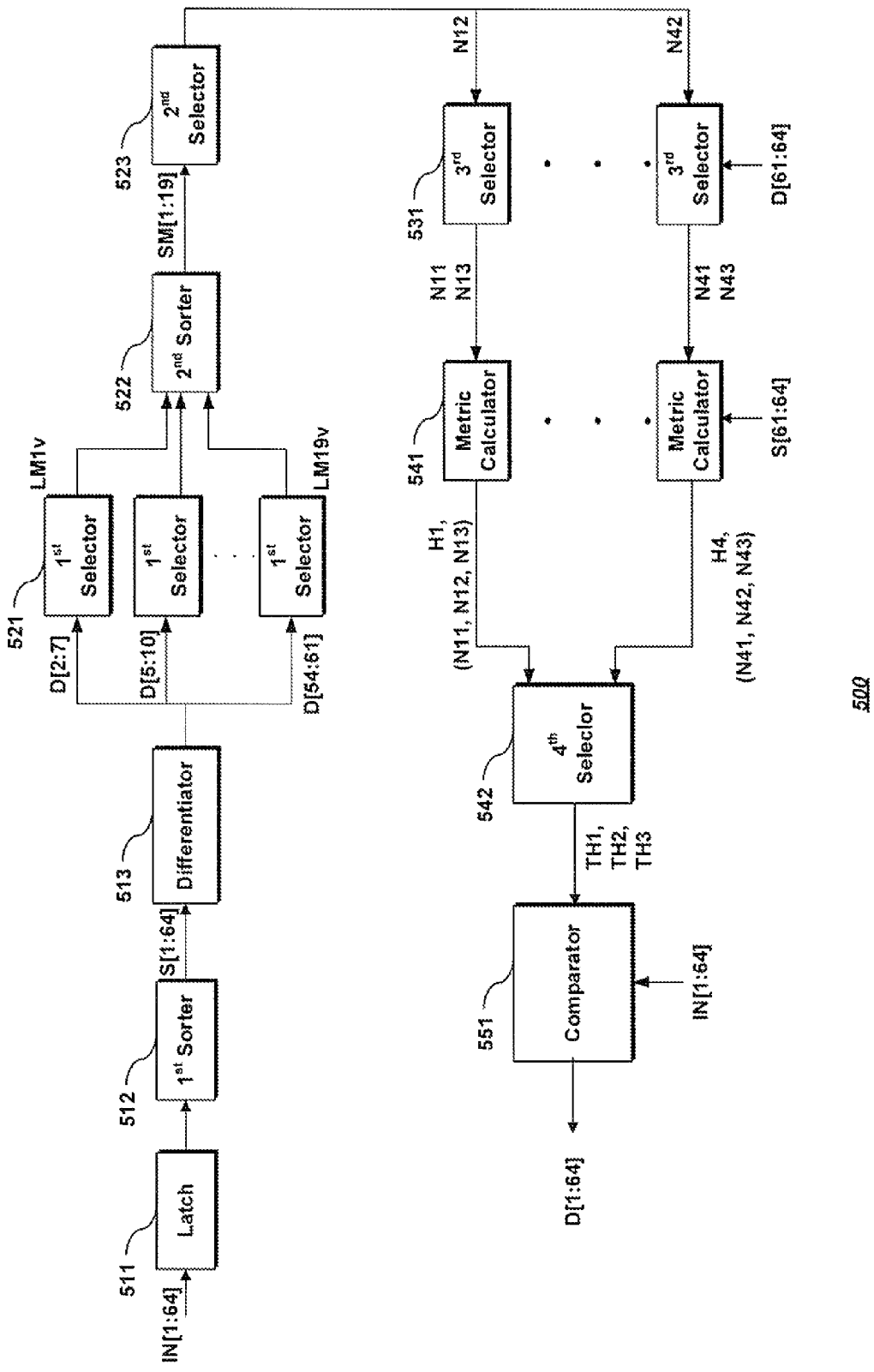
FIG. 5 is a detailed block diagram of a representation of a decision block of FIG. 2 to FIG. 4.

FIG. 5 is a detailed block diagram illustrating a representation of an embodiment of the decision block 500 illustrated s in FIG. 2 to FIG. 4.

In FIG. 5, it may be assumed, for example but not limited to, that the reading circuit 300 simultaneously reads 64 values from the memory cell array 100 and outputs the read values.

The analog-to-digital conversion unit 400 converts the 64 analog values output from the reading circuit 300 into digital values and provides the digital values to the decision block 500.

Further, in FIG. 5, it may be assumed, for example but not limited to, that each cell of the memory cell array 100 is a multilevel cell that stores 2 bits.

The decision block 500 may include a latch 511 that stores 64 input digital values IN. The decision block 500 may include a first sorter 512 that sorts data of the latch 511 and outputs a first array S. The decision block 500 may include a differentiator 513 that calculates a difference of adjacent values in the first array S and outputs a second array D.

In an embodiment, the first sorter 512 sorts the values of the latch 511 in an ascending order, so that the first array S has a large value as it goes to an upper index.

In an embodiment, a relation between the first array S and the second array D may be expressed by the following Equation 1.

$$D[i]=S[i+1]-S[i](1\leq i\leq 63), D[64]=0 \qquad \text{Equation 1}$$

The decision block 500 further includes M first selector 521 that divide the second array D into M (=19) windows and output a maximum value from each window, a second sorter 522 that sorts M maximum values LM1v to LM19v, and a second selector 523 that selects L (=4) maximum values from the output SM of the second sorter 522.

In an embodiment, a $j^{th}$ first selector 521 selects a maximum value from 6 values (D[3j−1:3j+4], 1≤i≤19) output from the differentiator 513, and outputs the selected maximum value. That is, the size of each of the M windows is 6 and each window overlaps with an adjacent window by a size as large as 3.

The second selector 523 selects the L (=4) maximum values from the M (=19) output values. Each of the selected L maximum values (N12, . . . , N42) is associated with a candidate of a first threshold value.

For example, it may be possible to know indexes corresponding to the L maximum values and to select a value of a corresponding index from the first array S.

The threshold value indicates a value found using a corresponding index in the first array S. However, since the value of the first array S is decided according to indexes, an index itself may be expressed as a threshold value in the range in which there is no confusion.

The first threshold value exists in the middle of three threshold values and may be used to distinguish a logic level "01" from a logic level "10".

As described above, the first selector 521, the second sorter 522, and the second selector 523 correspond to a configuration for selecting the threshold value existing in the middle of three threshold values, and illustrate one method for selecting L first candidate to threshold values from the 64 values output from the first sorter 512 according to differences with adjacent values.

In an embodiment, the second array may be, for example, divided into M non-overlapping windows, a plurality of maximum values may be selected from the windows, and L maximum values may be selected from the plurality of selected maximum values, so that candidates of the first threshold value may be decided.

In an embodiment, the L first candidate threshold values may be directly selected from the second array D in an order in which a size is a maximum, and this may correspond to an example in which a window size is 1 in an example in which non-overlapping windows are used.

Various methods for selecting the first candidate threshold values may exist in addition to the aforementioned method; however, the difference performance may occur according to used methods.

Figure 11:
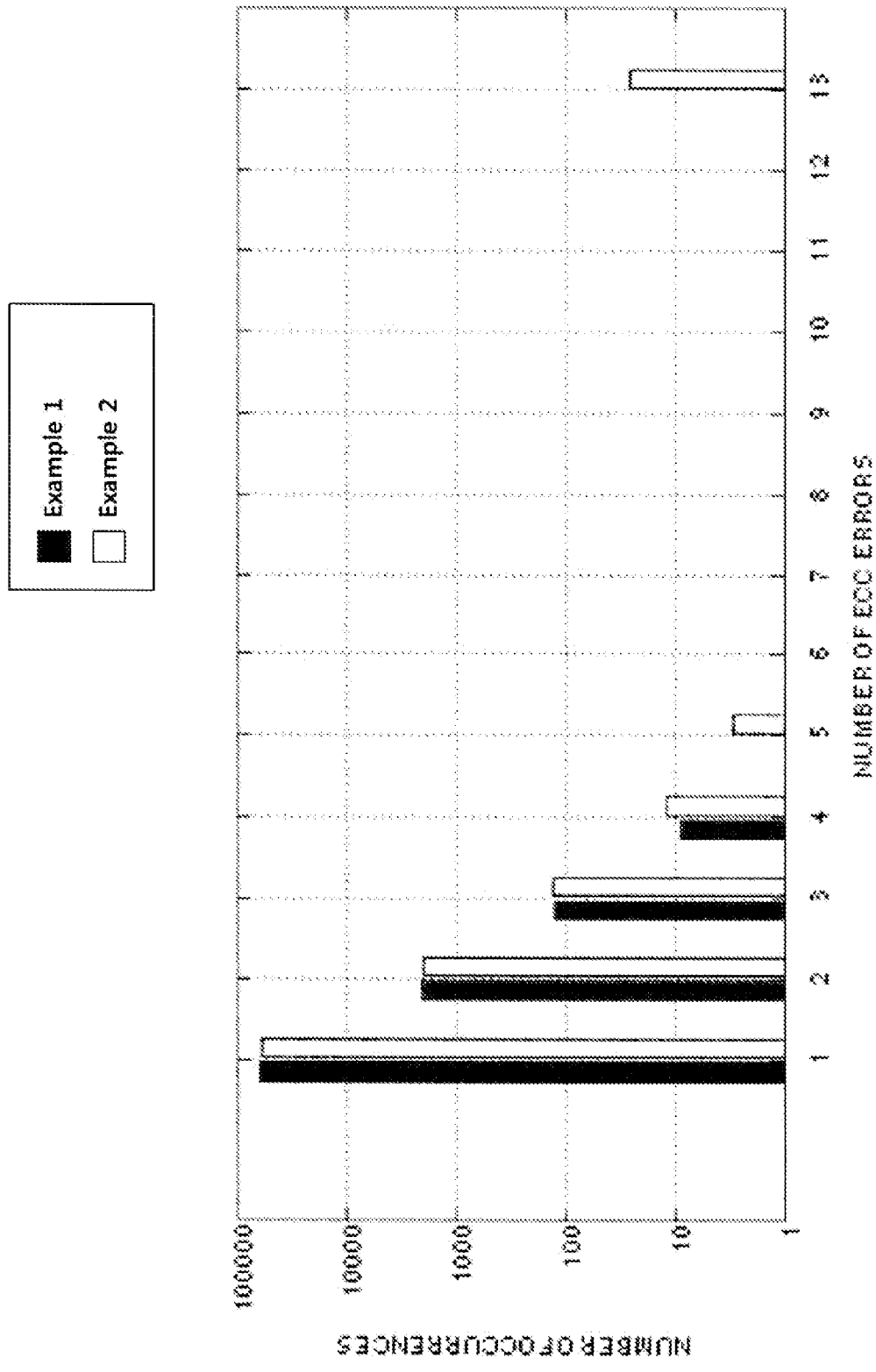

FIG. 11 illustrates performance differences between examples 1 and 2. Example 1 is an example of dividing the second array into M overlapping windows, selecting maximum values from the windows, and selecting L maximum values from the selected maximum values. Example 2 is an example of directly selecting L first candidate threshold values from the second array.

Referring to FIG. 11, a horizontal axis denotes the number of ECC errors and a vertical axis denotes the number of times corresponding to the number of the ECC errors. As illustrated in FIG. 11, an example in which the number of the ECC errors is 5 or more does not exist in the example 1, but an example in which the number of the ECC errors is 5 or more exists in the example 2. This represents that in the example of using the method of the example 1, the size of the ECC block can be designed to be even smaller, as compared with the example of using the method of the example 2.

The decision block 500 further includes L third selector 531. The L third selectors 531 select second candidate threshold values and third candidate threshold values with respect to each of the L first candidate threshold values output from the second selector 523 and select the total L candidate threshold value sets. The decision block 500 also includes metric calculator 541. The metric calculator 541 calculate metric values H with respect to each of the L candidate threshold value sets and output the metric values H.

Each of the L third selector 531 divides the second array into two groups based on any one of the L first candidate threshold values, selects a maximum value in each group, selects the second candidate threshold value and the third candidate threshold value from the maximum values, and generates a candidate threshold value set.

For example, the third selector 531 having received the first candidate threshold value N12 may divide the second array D into two groups based on the first candidate threshold value N12, select a maximum value in each group, and set the second candidate threshold value N11 and the third candidate threshold value N13.

The first candidate threshold value N12, the second candidate threshold value N11, and the third candidate threshold value N13 are one candidate threshold value set.

In an embodiment, one or two or more second candidate threshold values may be selected, or one or two or more third candidate threshold values may be selected. In this example, the number of candidate threshold value sets may be increased according to the number of combinations.

The metric calculator 541 calculates the metric value H by using a corresponding candidate threshold value set and the first array S.

First, the metric calculator 541 divides the 64 values of the first array into four sections based on the first candidate threshold value and the third candidate threshold value.

In this example, the start index values of the sections are indicated by G1b, G2b, G3b, and G4b and the last index values of the sections are indicated by G1e, G2e, G3e, and G4e.

The following Equation 2 is an example of an equation for calculating a metric value in an embodiment.

$$H = \sum_{k=1}^{k=4} w_i \times N_i \times (S[G_{ke}] - S[G_{kb}]) \quad \text{Equation 2}$$

In Equation 2, N1, N2, N3, and N4 are the number of elements included in each section and w1, w2, w3, and w4 are constants as weighted values assigned to each section.

The metric value H calculated by Equation 2 is used to evaluate the degree of division in which the sections have been gathered in a narrow range, and as the metric value H is small, it represents that the first array has been more preferably divided.

In an embodiment, a L1-norm value of Equation 3 is calculated as a metric value.

$$H = \sum_{k=1}^{k=4} \sum_{n=G_{kb}}^{n=G_{ke}} |S[n] - g\mu_k| = \sum_{k=1}^{k=4} \sum_{n=G_{kb}}^{n=G_{ke}} \left|S[n] - \frac{S[G_{kb}] + S[G_{ke}]}{2}\right| \quad \text{Equation 3}$$

The metric value of Equation 3 is used to evaluate the degree in which the sections are densely aggregated about the geometric median values thereof, and as the metric value is small, it represents that the first array has been more preferably divided. In an embodiment, in Equation 3, an average value may be used instead of the geometric median value.

The decision block 500 further may include a fourth selector 542 that selects one threshold value set TH1, TH2, and TH3 from candidate threshold value sets having a minimum metric value among the L candidate threshold value sets output from the metric calculator 541.

The decision block 500 further may include a comparator 551 that compares the threshold values selected by the fourth selector 542 with input data IN, and decides a logic level of the input data.

Figure 6:
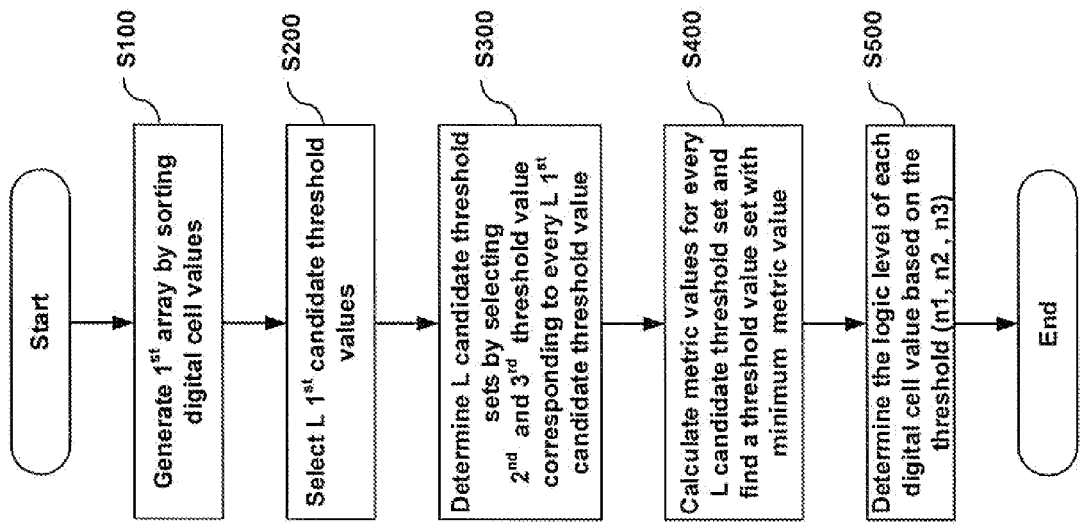
FIG. 6 is a flowchart illustrating a representation of the operation of a decision block according to an embodiment.

FIG. 6 is a flowchart illustrating a representation of the operation method of the decision block 500 according to an embodiment.

First, the decision block 500 generates a first array by sorting input digital values (S100).

Next, the decision block 500 selects L first candidate threshold values from the first array (S200).

Figure 7:
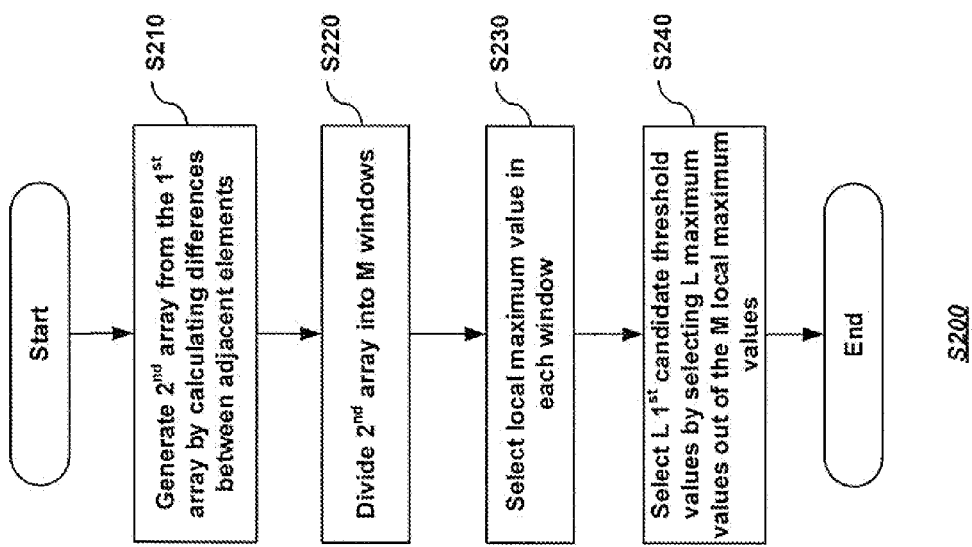
FIG. 7 is a representation of a detailed flowchart of step S200 of FIG. 6.

With reference to FIG. 7, an example of a representation of the method for selecting the L first candidate threshold values will be described.

First, the decision block 500 calculates differences of adjacent values in the first array including sorted values, and generates a second array (S210). A relation between the value of the first array and the value of the second array has been described through Equation 1 above.

Next, the decision block 500 divides the second array into M windows (S220), selects maximum values from the windows (S230), and selects L maximum values from the selected M maximum values to select first candidate threshold values (S240).

FIG. 7 illustrates an example of selecting the L first candidate threshold values, and the scope of the embodiments are not limited thereto.

Returning to FIG. 6, the decision block 500 selects a second candidate threshold value and a third candidate threshold value with respect to each of the L first candidate threshold values, and decides L candidate threshold value sets (S300).

Figure 8:
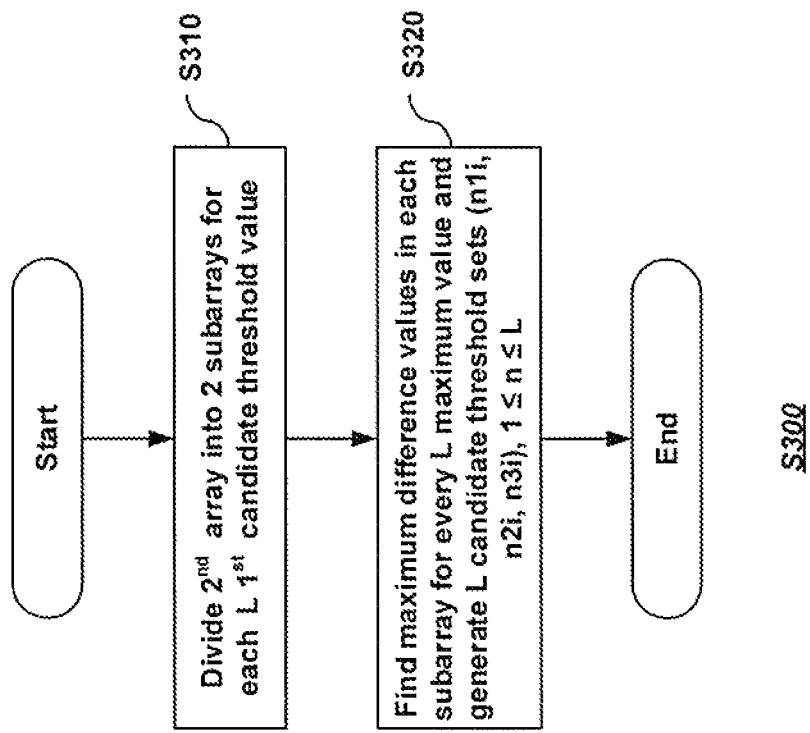
FIG. 8 is a representation of a detailed flowchart of step S300 of FIG. 6.

With reference to FIG. 8, an example of the representation of a method for deciding the second candidate threshold value and the third candidate threshold value will be described.

First, the decision block 500 divides the second array into two sub arrays with respect to each of the L first candidate threshold values (S310).

Next, the decision block 500 selects the second candidate threshold value and the third candidate threshold value from each of the two sub arrays, and decides L candidate threshold value sets (S320). For example, the second candidate threshold value corresponds to a maximum value selected from one of the two sub arrays, and the third candidate threshold value corresponds to a maximum value selected from the other sub array.

Then, the decision block 500 calculates L metric values by using the L candidate threshold value sets and the first array, and decides a threshold value from a candidate threshold value set that minimizes a metric value (S400). An example of the method for calculating the metric value has been described with reference to Equation 2 and Equation 3 above.

Last, the decision block 500 compares the decided threshold value with the input value and determines a logic level of the input value (S500).

Figure 9:
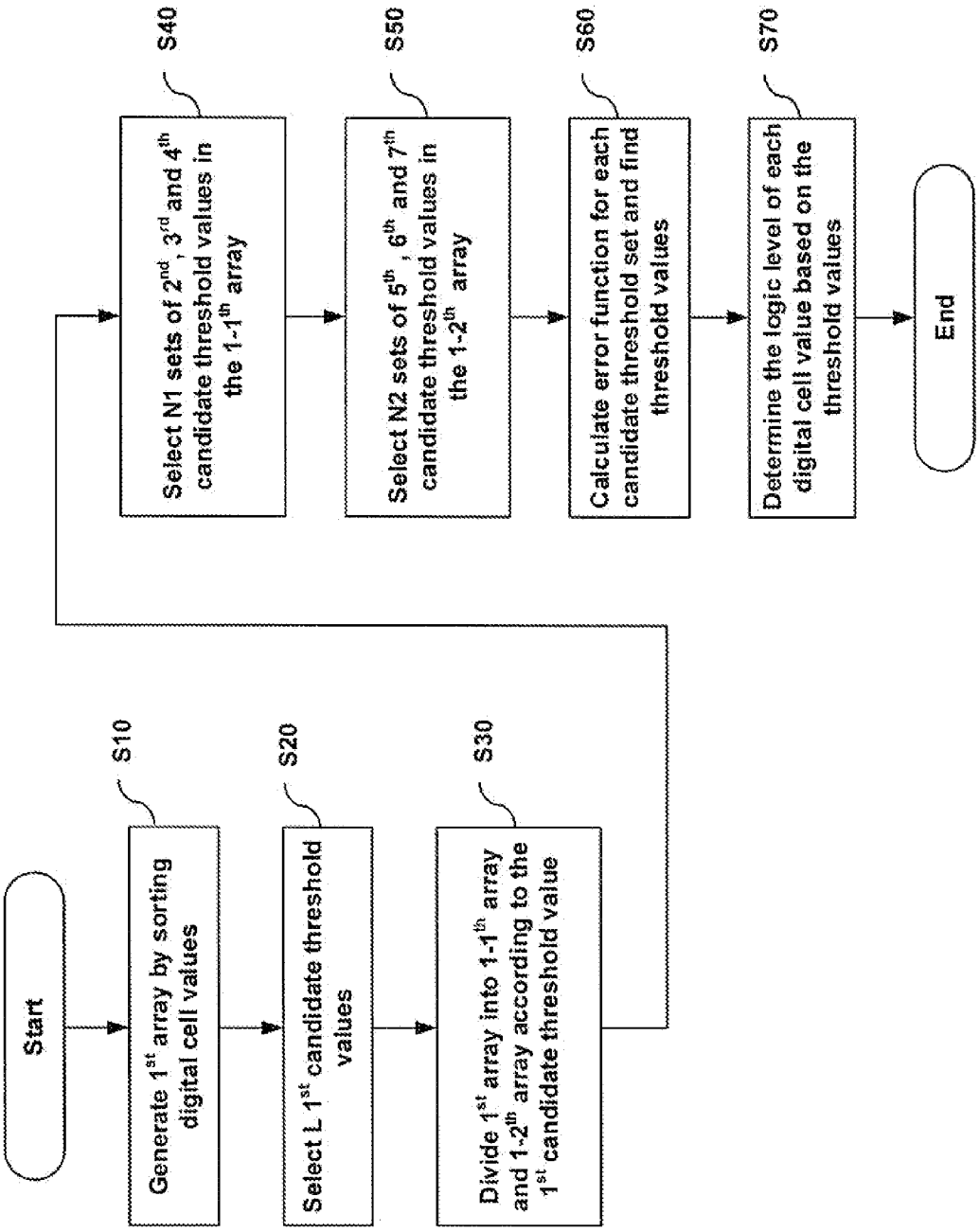
FIG. 9 is a flowchart illustrating a representation of the operation of a decision block according to an embodiment.

FIG. 9 is a flowchart illustrating a representation of the operation method of the decision block 500 in the example of using a memory cell array including memory cells TLC that store 3 bits, respectively.

Since the memory cell TLC storing the 3 bits may store a total of 8 logic levels, seven threshold values are required.

First, the decision block 500 generates a first array by sorting input values (S10).

Next, the decision block 500 selects L first candidate threshold values (S20). A first threshold value corresponds to a threshold value existing in the middle of the required seven threshold values.

In order to select the L first candidate threshold values, the methods disclosed in FIG. 6 and FIG. 7 may be used.

Then, the decision block 500 divides the first array into a 1-1$^{th}$ array and a 1-2$^{th}$ array based on the first candidate threshold value with respect to each of the L first candidate threshold values (S30).

Then, the decision block 500 selects N1 second, third, and fourth candidate threshold value sets with respect to the 1-1$^{th}$ array (S40), and selects N2 fifth, sixth, and seventh candidate threshold value sets with respect to the 1-2$^{th}$ array (S50). The N1 and the N2 are natural numbers and may be equal to each other or not.

Each step S40 and step S50 may be performed using a method similar to that of performing each of step S200 and step S300 of FIG. 6.

For example, in step S40, the decision block 500 may decide N1 third candidate threshold values from the 1-1$^{th}$ array, divide the 1-1$^{th}$ array into two lower arrays with respect to each of the N1 third candidate threshold values, and select second and fourth candidate threshold values from the two lower arrays.

The selection of the N1 third candidate threshold values corresponds to step S200 of FIG. 6 and the selection of the second and fourth candidate threshold values corresponds to step S300 of FIG. 6.

When step S10, step S20, step S30, step S40, and step S50 are performed, the total L×N1×N2l candidate threshold value sets are obtained. The decision block 500 calculates a metric value by using the candidate threshold value sets and the first array, and selects one threshold value set according to the metric value (S60).

Then, the decision block 500 decides the logic levels of the digital input values by using the selected threshold value set (S70).

The method illustrated in FIG. 9 may be similarly expanded to a memory cell array including a memory cell that stores 4 bits or more.

Figure 10:
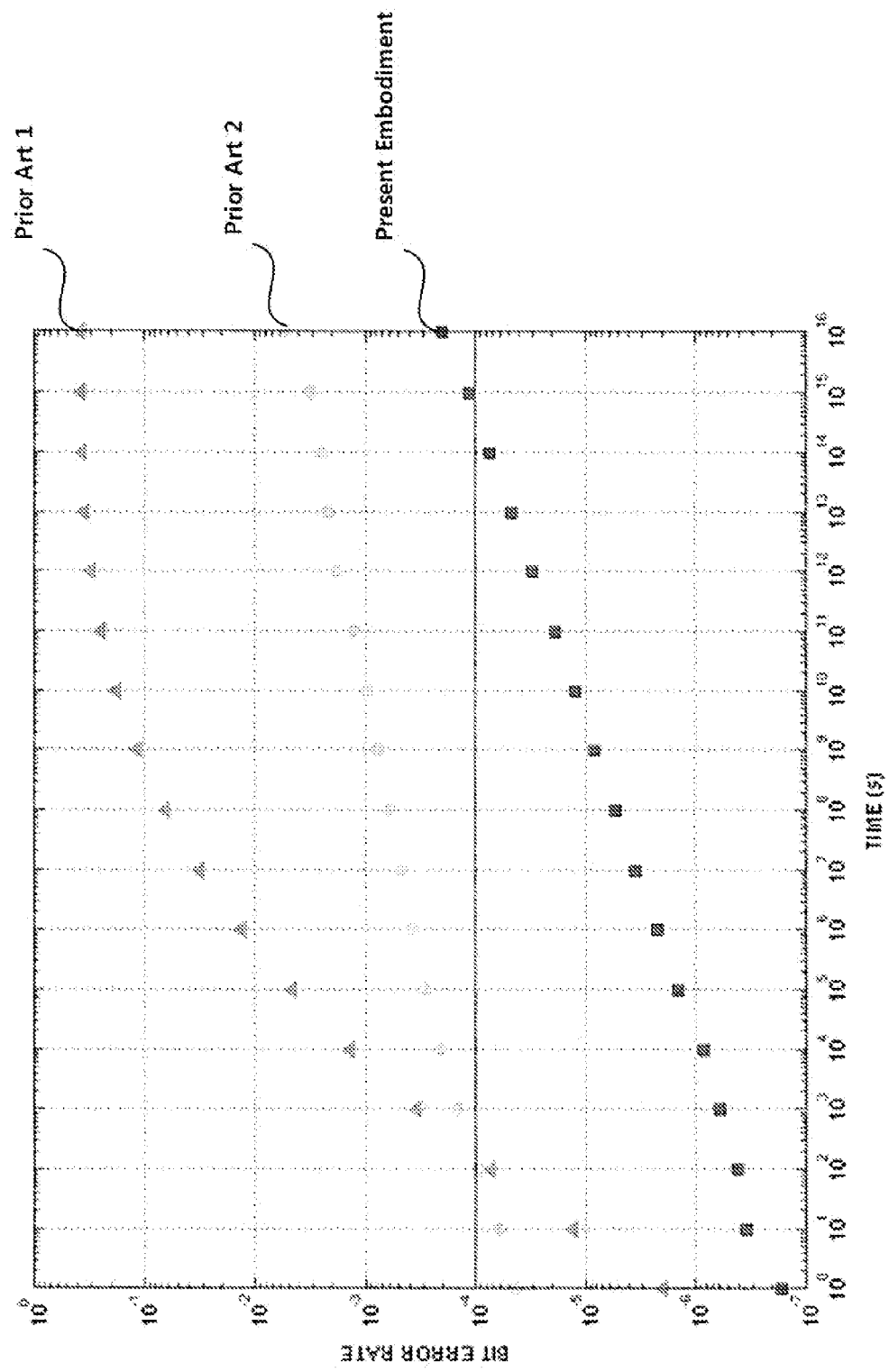
FIG. 10 and FIG. 11 are graphs for explaining an effect of an embodiment.

FIG. 10 is a graph for explaining an effect of an embodiment.

In the graph, a horizontal axis denotes passage time after data is written and a vertical axis denotes a bit error rate.

In the graph, Prior Art 1 indicates the case of deciding a logic level by fixedly using a threshold value. In the graph, Prior Art 2 indicates the case of employing a part of a memory cell as a reference cell, comparing a value of the reference cell with a value of the memory cell, and deciding a logic level of the memory cell.

As illustrated in FIG. 10, according to an embodiment, it can be understood that a bit error rate is very low as compared with conventional arts 1 and 2 regardless of passage time (i.e., Present Embodiment). Particularly, the present embodiments may further reduce the error occurrence probability without using the reference cell as with conventional art 2, thereby providing an excellent effect while substantially preventing the waste of a storage space added due to the reference cell.

Figure 12:
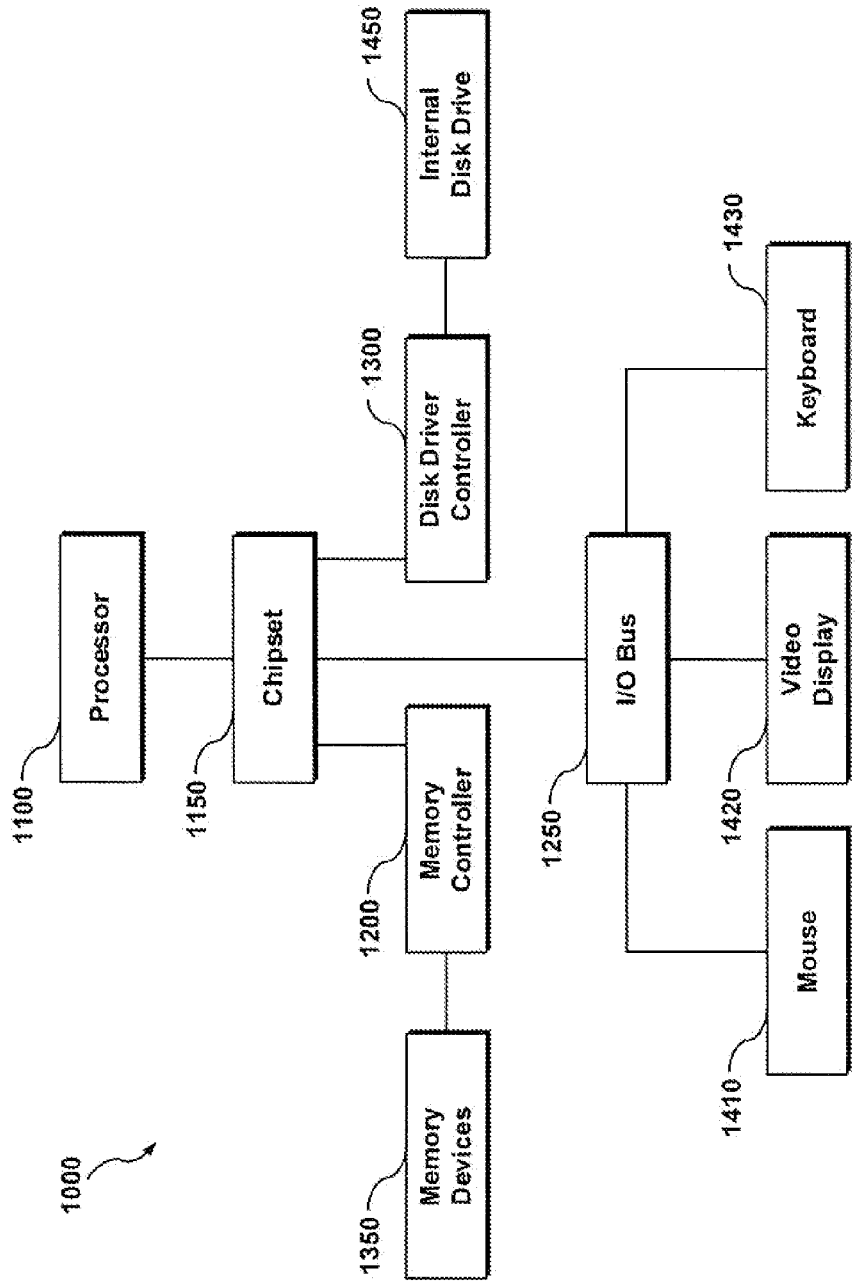
FIG. 12 illustrates a block diagram of an example of a representation of a system employing the semiconductor device, semiconductor memory device, memory system, or methods in accordance with the embodiments discussed above with relation to FIGS. 2-11.

The semiconductor memory devices, memory systems, or methods discussed above (see FIGS. 2-11) are particular useful in the design of memory devices, processors, and computer systems. For example, referring to FIG. 12, a block diagram of a system employing the semiconductor memory devices, memory systems, or methods in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory device, memory system, or employ at least one method as discussed above with reference to FIGS. 2-11. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory device, memory system, or employ at least one of the method as discussed above with relation to FIGS. 2-11, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 12 is merely one example of a system employing the semiconductor memory devices, memory systems, or methods as discussed above with relation to FIGS. 2-11. In alternate embodiments, such as cellular phones or digital cameras, the components may differ from the embodiments illustrated in FIG. 12.

While certain embodiments have been described above, it will be understood to those skilled in the art that the embodiments described are by way of example only. Accordingly, the semiconductor device and the operating method thereof described herein should not be limited based on the described embodiments. Rather, the semiconductor device and the operating method thereof described herein should only be limited in light of the claims that follow when taken in conjunction with the above description and accompanying drawings.

What is claimed is:

1. A semiconductor device comprising:
  a candidate selector configured for generating a plurality of candidate threshold value sets from a first array generated by sorting a plurality of digital values corresponding to a plurality of analog signals output from a memory cell array;
  a threshold value selector configured for selecting one candidate threshold value set of the plurality of candidate threshold value sets as a threshold value set; and
  a comparator configured for deciding logic levels of the plurality of digital values according to the selected threshold value set.

2. The semiconductor device according to claim 1, wherein the candidate selector comprises:
  a first candidate selector configured for selecting a plurality of first candidate threshold values; and
  a second candidate selector configured for selecting one or two or more second candidate threshold values having a smaller size and one or two or more third candidate threshold values having a larger size with respect to each of the plurality of first candidate threshold values.

3. The semiconductor device according to claim 2, further comprising:
  a sorter configured for sorting the plurality of digital values according to a size and outputs the first array.

4. The semiconductor device according to claim 3, wherein the first candidate selector selects the plurality of first candidate threshold values according to differences between adjacent values of the first array.

5. The semiconductor device according to claim 4, wherein the first candidate selector comprises:
  M first selectors configured for dividing the first array into M windows (M is a natural number) and for selecting a value in which a difference between adjacent values is maximum in each window; and
  a second selector configured for selecting the plurality of first candidate threshold values according to an output of the M first selectors.

6. The semiconductor device according to claim 4, wherein the second candidate selector comprises:
  a third selector configured for dividing the first array into a $1\text{-}1^{th}$ array and a $1\text{-}2^{th}$ array based on the plurality of first candidate threshold values, selecting a second candidate threshold value from the a $1\text{-}1^{th}$ array, and selecting a third candidate threshold value from the a $1\text{-}2^{th}$ array.

7. The semiconductor device according to claim 6, wherein the third selector selects a value, in which a difference between adjacent values is maximum in the $1\text{-}1^{th}$ array, as the second candidate threshold value, and selects a value, in which a difference between adjacent values is maximum in the $1\text{-}2^{th}$ array, as the third candidate threshold value.

8. The semiconductor device according to claim 3, wherein the threshold value selector operates the plurality of candidate threshold value sets and the first array to calculate a plurality of metric values, and compares the plurality of metric values to select the threshold value set.

9. A semiconductor memory device comprising:
   a memory cell array;
   an analog-to-digital conversion unit configured for outputting a plurality of digital values corresponding to a plurality of analog signals output from the memory cell array; and
   a decision block configured for selecting a threshold value set from a first array generated by sorting the plurality of digital values and deciding logic levels of the plurality of digital values according to the selected threshold value set.

10. The semiconductor memory device according to claim 9, wherein the decision block comprises:
    a candidate selector configured for generating a plurality of candidate threshold value sets from the first array;
    a threshold value selector configured for selecting one candidate threshold value set of the plurality of candidate threshold value sets as a threshold value set; and
    a comparator configured for deciding the logic levels of the plurality of digital values according to the selected threshold value set.

11. The semiconductor memory device according to claim 10, wherein the candidate selector comprises:
    a first candidate selector configured for selecting a plurality of first candidate threshold values; and
    a second candidate selector configured for selecting one or two or more second candidate threshold values having a smaller size and one or two or more third candidate threshold values having a larger size with respect to each of the plurality of first candidate threshold values.

12. A memory system comprising:
    a semiconductor memory device configured for outputting a plurality of analog signals output from a memory cell array;
    an analog-to-digital conversion unit configured for outputting a plurality of digital values corresponding to the plurality of analog signals output from the memory cell array; and
    a decision block configured for selecting a threshold value set from a first array generated by sorting the plurality of digital values and deciding logic levels of the plurality of digital values according to the selected threshold value set.

13. The memory system according to claim 12, wherein the decision block comprises:
    a candidate selector configured for generating a plurality of candidate threshold value sets from the first array;
    a threshold value selector configured for selecting one candidate threshold value set of the plurality of candidate threshold value sets as a threshold value set; and
    a comparator configured for deciding the logic levels of the plurality of digital values according to the selected threshold value set.

14. The memory system according to claim 13, wherein the candidate selector comprises:
    a first candidate selector configured for selecting a plurality of first candidate threshold values; and
    a second candidate selector configured for selecting one or two or more second candidate threshold values having a smaller size and one or two or more third candidate threshold values having a larger size with respect to each of the plurality of first candidate threshold values.

15. A memory system comprising:
    a semiconductor memory device including a memory cell array and an analog-to-digital conversion unit configured for outputting a plurality of digital values corresponding to a plurality of analog signals output from the memory cell array; and
    a decision block configured for selecting a threshold value set from a first array generated by sorting the plurality of digital values and decides logic levels of the plurality of digital values according to the selected threshold value set.

16. The memory system according to claim 15, wherein the decision block comprises:
    a candidate selector configured for generating a plurality of candidate threshold value sets from the first array;
    a threshold value selector configured for selecting one candidate threshold value set of the plurality of candidate threshold value sets as a threshold value set; and
    a comparator configured for deciding the logic levels of the plurality of digital values according to the selected threshold value set.

17. The memory system according to claim 16, wherein the candidate selector comprises:
    a first candidate selector configured for selecting a plurality of first candidate threshold values; and
    a second candidate selector configured for selecting one or two or more second candidate threshold values having a smaller size and one or two or more third candidate threshold values having a larger size with respect to each of the plurality of first candidate threshold values.

* * * * *